United States Patent
Sugiyama et al.

[11] Patent Number: 5,964,944
[45] Date of Patent: Oct. 12, 1999

[54] METHOD OF PRODUCING SILICON CARBIDE SINGLE CRYSTAL

[75] Inventors: Naohiro Sugiyama; Atsuto Okamoto; Toshihiko Tani, all of Nagoya; Nobuo Kamiya, Nisshin, all of Japan

[73] Assignee: Kabushiki Kaisha Toyota Chuo Kenkyusho, Aichi-ken, Japan

[21] Appl. No.: 08/820,888

[22] Filed: Mar. 21, 1997

[30] Foreign Application Priority Data

Mar. 29, 1996 [JP] Japan .................................. 8-103719

[51] Int. Cl.$^6$ .................................................. C30B 29/36
[52] U.S. Cl. .............................. 117/107; 117/2; 117/902; 117/935; 117/951; 438/931
[58] Field of Search .............................. 117/2, 107, 902, 117/935, 951; 438/931

[56] References Cited

U.S. PATENT DOCUMENTS

| | | | |
|---|---|---|---|
| 3,074,887 | 1/1963 | Carroll | 117/2 |
| 3,275,415 | 9/1966 | Chang | 117/951 |
| 3,520,740 | 7/1970 | Addamiano | 117/951 |
| 3,755,541 | 8/1973 | Strepkoff | 117/951 |
| 4,512,825 | 4/1985 | Addamiano | 148/175 |
| 4,855,254 | 8/1989 | Eshita | 117/902 |
| 4,866,005 | 9/1989 | Davis | 117/107 |

FOREIGN PATENT DOCUMENTS

| | | |
|---|---|---|
| 2-293398 | 12/1990 | Japan . |
| 6-1698 | 1/1994 | Japan . |
| 6-56596 | 3/1994 | Japan . |
| 6-128094 | 5/1994 | Japan . |
| 6-298600 | 10/1994 | Japan . |

OTHER PUBLICATIONS

Kobayashi et al. "Evaluation of structural quality of a silicon carbide (6H–SiC) ingle crystal grown by a vapor transport method by Rutherford backscattering spectroscopy", Journal of Applied Physics, vol. 65, No. 4, pp. 1790–1792, Feb. 15, 1989.

*Primary Examiner*—Robert Kunemund
*Attorney, Agent, or Firm*—Oblon, Spivak, McClelland, Maier & Neustadt, P.C.

[57] ABSTRACT

An easy and low-cost method of producing a large-size and high-purity silicon carbide (SiC) single crystal includes reacting silicon vapor directly with a carbon-containing compound gas under a heated atmosphere (growth space 14) to grow a silicon carbide single crystal (15) on a silicon carbide seed crystal (12), in which the silicon vapor generated from molten silicon (13) is used as a silicon vapor source, and a hydrocarbon gas (9) (e.g., propane gas) is used as the carbon-containing compound gas.

9 Claims, 1 Drawing Sheet

METHOD OF PRODUCING SILICON CARBIDE SINGLE CRYSTAL

FIELD OF THE INVENTION

The present invention relates to a method of producing a single crystal of silicon carbide (SiC) by a direct reaction between silicon (Si) vapor and a hydrocarbon gas.

BACKGROUND OF THE INVENTION

A single crystal of SiC is used as a substrate of an SiC semiconductor useful as a semiconductor device such as a high-temperature working device, a power device and a blue light-emitting device. Various methods of growing such an SiC single crystal have hitherto been known. Among these conventional methods of growing an SiC single crystal is a sublimation recrystallization method. In the sublimation recrystallization method, silicon carbide constituting a source material is sublimated in a graphite crucible, so that a silicon carbide single crystal is recrystallized on a silicon carbide single crystal substrate which is disposed at a low-temperature region in the crucible. In this case, the temperature of the silicon carbide constituting a source material, the temperature of the siliconcarbide substrate and the atmosphere in the graphite crucible are precisely controlled in order to obtain a high-quality siliconcarbide single crystal.

In the above process, the sublimation of the silicon carbide powder constituting a source material takes place from the surface of the silicon carbide powder and the silicon carbide powder at the opening surface (sublimation surface).

Silicon carbide partly decomposes upon sublimation (to thereby form decomposition products such as Si vapor, $Si_2C$ vapor and $SiC_2$ vapor). The released vapors (or gases) in total have a greater silicon content than the carbon content. As a result, a carbon layer remains on the silicon carbide powder at the opening surface. In other words, in the above-described method, the sublimated silicon carbide necessarily passes through the carbon layer during sublimation. This makes it difficult to stably supply silicon carbide vapor (source material gas).

To overcome the above problems in the sublimation recrystallization method, various techniques have been proposed. For example, Japanese unexamined patent publication No. 6-128094 (No. 1) discloses a method of producing a silicon carbide single crystal in which a silicon-component gas (e.g., silane or derivatives thereof) and/or a carbon-component gas (e.g., hydrocarbon gases such as methane and ethane) is/are introduced into a growth reaction area when growing a silicon carbide single crystal on a seed crystal by sublimating a silicon carbide source material, in order to cancel fluctuation of the sublimated gas composition caused with the progress of sublimation reaction.

Japanese unexamined patent publication No. 6-298600 (No. 2) discloses a method of growing an SiC single crystal by a sublimation recrystallization process comprising heating and sublimating an SiC powder source material to grow an SiC single crystal on a seed crystal comprising an SiC single crystal maintained at a temperature lower than the temperature of the source material, in which an Si-containing gas is supplied as another SiC source in addition to the SiC powder.

Japanese unexamined patent publication No. 6-1698 (No. 3) discloses a method of producing a bulk single crystal of silicon carbide, comprising growing a silicon carbide single crystal on a seed crystal by a sublimation recrystallization method, in which a silicide of a transition metal (e.g., tungsten silicide and tantalum silicide) is added to the silicon carbide powder.

Japanese unexamined patent publication No. 6-56596 (No. 4) discloses a method of producing a silicon carbide single crystal, comprising growing a silicon carbide single crystal by a sublimation recrystallization method using a seed crystal, in which silicon nitride is added to the silicon carbide constituting a source material.

In addition to the above-described sublimation recrystallization methods, for example, Japanese unexamined patent publication No. 2-293398 (No. 5) discloses a method of producing a high-quality crystalline silicon carbide by introducing a carbon-containing compound vapor and silicon vapor into a plasmareaction space (e.g., arc discharge space).

Furthermore, on page 609 of Technical Digest of "International Conference on SiC and Related Materials" (ICSCRM-95) (No. 6), it has been reported that a bulk single crystal of silicon carbide is obtained by carrying out a reaction represented by the following formula:

$$SiH_4 + C_3H_8 \rightarrow SiC$$

at a temperature of 1800° C. to 2300° C.

However, even the above-described methods of No. 1 to No. 4 cannot perfectly compensate the composition fluctuation of silicon carbide vapor due to partial decomposition of silicon carbide upon sublimation, so that it is difficult to achieve a constant stable state during recrystallization of silicon carbide. Furthermore, in the case of growing a semiconductor-grade silicon carbide single crystal, which contains impurities in very little amounts, it is necessary to supply a source material of a high-purity silicon carbide powder commensurate with the desired single crystal. However, such a highly pure material costs much, which leads to a high cost of production of a silicon carbide single crystal.

The above-described method of No. 5 requires an apparatus of a large-volume plasma to obtain a large-size single crystal of silicon carbide. However, the plasma space (the arc discharge space) is not suitable for the crystal growth in a large size due to the narrow area of the arc discharge space. Therefore, this method is disadvantageous in that the producing apparatus necessarily becomes large-scale and costs much.

The above-described method of No. 6 is not suitable to mass production of bulk single crystals because the method employs expensive silane ($SiH_4$) gas as a source material. Further, the growth rate of the crystal may decrease because silane contains hydrogen.

As described above, in producing a silicon carbide single crystal, the crystal growth using a recrystallization technique (methods of No. 1 to No. 4) has difficulties of accomplishing a stable (constant) crystal growth and obtaining a high-purity single crystal. This causes deterioration of electrical characteristics of a semiconductor substrate comprising the silicon carbide single crystal obtained by the methods. The other methods (methods of No. 5 and No. 6) also have difficulties of providing a low-cost production of a large-size crystal.

As a result of the intensive studies made by the present inventors to solve the above-described problems, the present invention has been accomplished.

SUMMARY OF THE INVENTION

An object of the present invention is to provide an easy and low-cost method of producing a large-size and high-purity single crystal of silicon carbide.

The method of producing a silicon carbide single crystal of the present invention comprises reacting silicon vapor directly with a carbon-containing compound gas under a heated atmosphere to grow a silicon carbide single crystal on a silicon carbide seed crystal, wherein the silicon vapor generated from molten silicon is employed as a silicon vapor source and a hydrocarbon gas is employed as the carbon-containing compound gas.

DETAILED DESCRIPTION OF THE INVENTION

Figure 1:
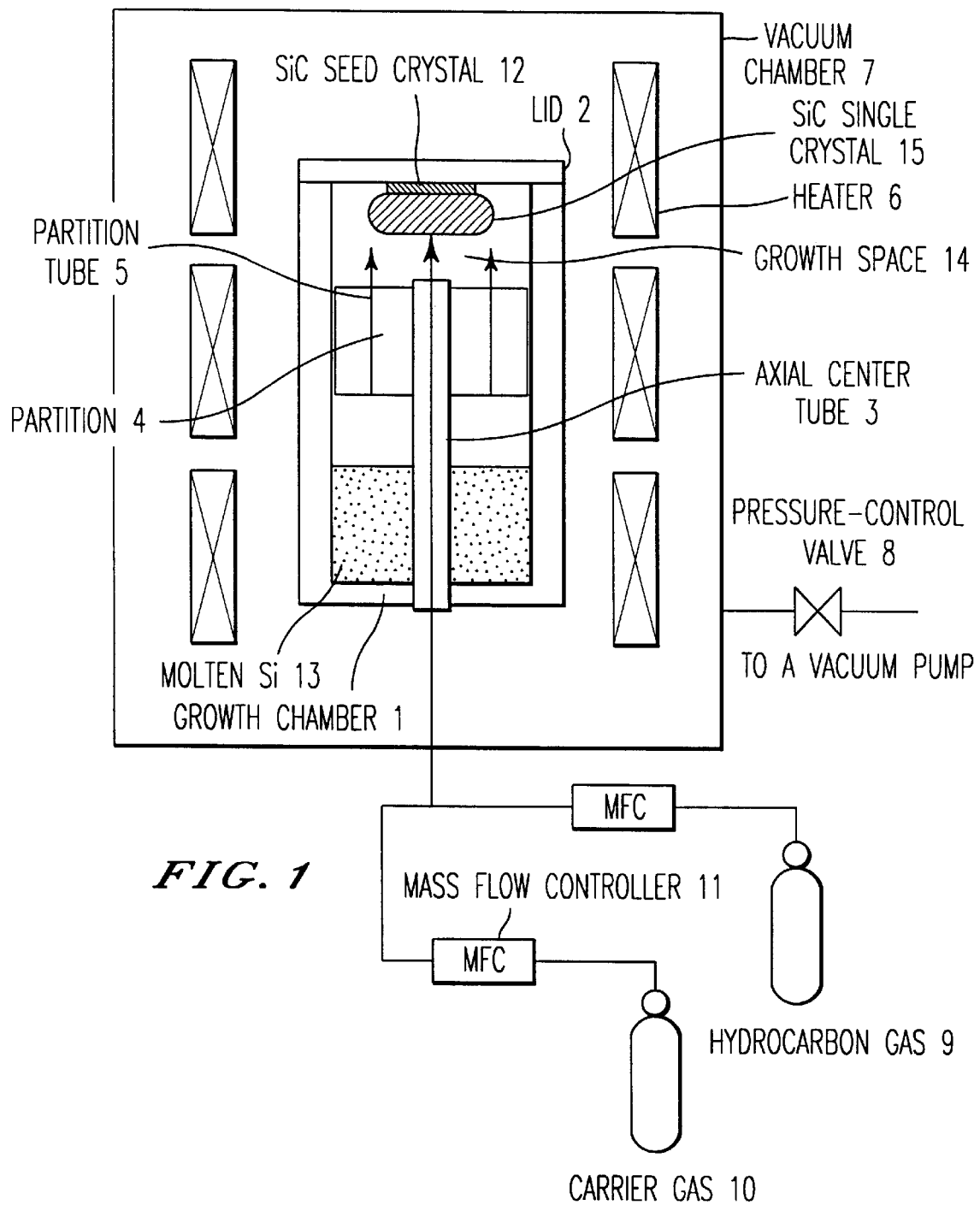
FIG. 1 is an explanatory drawing showing an example of the SiC single crystal growing apparatus for use in the method of the present invention.

The hydrocarbon for use in the present invention may be any hydrocarbon which is in the solid, liquid or gas state at room temperature, as long as the hydrocarbon is in the gas state under the conditions of the reaction with silicon vapor. Such a hydrocarbon in the solid or liquid state at room temperature is gasified upon use by a method suitable to the hydrocarbon. Typical examples of the hydrocarbon for use in the present invention include aromatic hydrocarbons and aliphatic hydrocarbons. Specific examples of the aromatic hydrocarbon include benzene, toluene and xylene. Specific examples of the aliphatic hydrocarbon include saturated hydrocarbons (e.g., paraffin hydrocarbons such as $CH_4$, $C_2H_6$ and $C_3H_8$) and unsaturated hydrocarbons (e.g., olefin hydrocarbons such as $C_2H_4$ and acetylene hydrocarbons such as $C_2H_2$).

The hydrocarbon may be used alone or in combination of two or more thereof. In the case of using a hydrocarbon in the gas state at room temperature, or for the purpose of carrying a gaseous hydrocarbon, a carrier gas (e.g., an inert gas such as Ar gas) may be used in combination with the hydrocarbon as needed. If necessary, such a carrier gas may also be used for carrying silicon vapor.

The size and form of the crystal growing apparatus (apparatus for producing a silicon carbide single crystal) for use in the method of the present invention may be suitably selected according to the size and form of the desired silicon carbide single crystal. The reaction conditions such as the temperature of the heated atmosphere are also suitably determined according to parameters such as the size or form of the desired silicon carbide single crystal, the supply rate of silicon vapor and a hydrocarbon gas, the kind of the hydrocarbon and the carrier gas, use or nonuse of a carrier gas. For example, it is preferable to carry out the reaction between silicon vapor and a carbon-containing compound gas under a condition that the temperature of the silicon carbide seed crystal is between 2000° C. (inclusive) and 2500° C. (inclusive).

Examples of materials suitable for the reaction chamber (e.g., the growth chamber 1 and the partition 4 in FIG. 1) include graphite, SiC coated graphite, a metal with a high melting point, such as, Ta and W, and a carbide of the metal with a high melting point, which are stable at high or elevated temperature.

The present invention is explained below in further detail in the following Examples.

EXAMPLE 1

Example 1 of the present invention is explained by reference to FIG. 1. FIG. 1 shows an example of the apparatus for growing an SiC single crystal for use in the method of the present invention. The structure of the apparatus is as follows. The apparatus has a growth chamber 1 having an opening portion at the top and a lid 2 that covers the opening portion of the growth chamber. The growth chamber 1 has an axial center tube 3 which facilitates the gas introduction to the axial center of the chamber. In the center of the chamber, a partition 4 is provided which separates the bottom portion of the chamber from the opening portion and has partition tubes 5 connecting the bottom portion of the chamber and the opening portion. In this Example, a high-purity graphite was adopted as a material of the growth chamber 1. Outside the growth chamber 1, three heaters 6 are provided which independently control the lid portion, the partition portion, the bottom portion of the chamber, respectively. Each of the temperatures of the lid portion, the partition portion and the bottom portion of the chamber is measured with an optical pyrometer (not shown in the figure). Based on the measurement, the output control of the corresponding heater 6 is carried out.

The growth chamber 1 and the heater 6 are contained in a vacuum chamber 7. The pressure of the reaction atmosphere is controlled by a vacuum pump (not shown in the figure) and a pressure-control valve 8. The apparatus is designed to introduce a hydrocarbon gas 9 and a carrier gas 10 (e.g., Ar and/or $H_2$) into the axial center tube 3 through the vacuum chamber 7 from the exterior of the chamber. A mass flow controller (MFC) 11 controls the flow rate of these gases.

The procedure of the production of a single crystal (single crystal growth) is explained as follows. Two hundred grams of silicon powder is loaded on the bottom portion of the growth chamber 1 and an SiC seed crystal 12 is adhered onto the lid 2. Subsequently, the growth chamber 1 is disposed in the vacuum chamber 7. After the vacuum chamber is evacuated down to $1 \times 10^{-6}$ Torr, Ar gas is introduced therein up to 500 Torr to carry out the gas substitution in the atmosphere. Then, the growth chamber 1 is heated with the heaters 6 to set each of the temperatures of the silicon source material, the partition and the seed crystal at 2100° C., 2350° C. and 2300° C., respectively. After the temperatures are stabilized, the pressure in the atmosphere is gradually reduced to 10 Torr over about an hour and the pressure of the atmosphere is then maintained at 10 Torr by controlling the opening and closing of the pressure-control valve 8. At the same time, $C_3H_8$ gas and Ar gas are introduced into the axial center tube 3 through the mass flow controller 11 at a flow rate of 40 SCCM (standard cubic centimeter per minute) and a flow rate of 200 SCCM, respectively.

The silicon charged at the bottom portion of the growth chamber 1 becomes molten silicon 13 by heating. The molten silicon has a silicon vapor pressure corresponding to the ambient temperature. Vaporized silicon diffuses in the partition tube 5 to reach a growth space 14 onto which the SiC seed crystal 12 is adhered. On the other hand, $C_3H_8$ gas transported with the carrier gas 10 is also introduced into the growth space 14 through the axial center tube 3. These gases react with each other in the growth space 14 to thereby form silicon carbide. The silicon carbide thus formed is deposited on the SiC seed crystal 12 and also on the inner surface around the top of the growth chamber 1. Silicon carbide deposited on the SiC seed crystal 12 is grown as an SiC single crystal 15. The gases that is not involved in the above-described reaction pass through the lid 2 to thereby be released to the outside the growth chamber 1. (The release path is not shown in the figure.)

After maintaining the above-described conditions for 6 hours, heating was stopped to terminate the production (crystal growth) of the SiC single crystal 15. This crystal growth provided on the SiC seed crystal 12 an SiC single crystal 15 in the form of an ingot having a height of about 6 mm. The growth rate of the SiC single crystal 15 was 1 mm/hour on the average.

The impurity concentration of the obtained SiC single crystal 15 was measured by glow discharge mass spectroscopy. As a result, the impurity concentration of the SiC single crystal 15 was found to be not greater than 0.1 ppm. Thus, the obtained SiC single crystal was an extremely highly pure crystal.

EXAMPLE 2

A silicon carbide single crystal was produced using the same crystal growing apparatus as in Example 1. The crystal growth conditions of the silicon carbide single crystal were set in the same manner as in Example 1. Specifically, each of the temperatures of the silicon source material, the partition and the seed crystal was set at 2100° C., 2350° C. and 2300° C., respectively, and C3H8 gas and Ar gas were introduced through the axial center tube 3 at a flow rate of 40 SCCM and 200 SCCM, respectively. Crystal growth was carried out for 18 hours with the pressure of the atmosphere maintained at 10 Torr. As a result, an SiC single crystal 15 was obtained, which was in the form of an ingot having a height of about 18 mm. The growth rate of the SiC single crystal 15 was 1 mm/hour on the average. The results of Examples 1 and 2 demonstrate that the growth rate of the SiC single crystal is constant regardless of the variation of the growth time. From the fact that there was remaining silicon at the bottom portion of the growth chamber 1 after completing the crystal production of Examples, it is assumed that the vapor pressure of silicon corresponding to the heating temperature was maintained at the time when the crystal growth of the silicon carbide single crystal was terminated.

In Examples 1 and 2, a seed crystal having a diameter of 10 mm was employed as a seed crystal of silicon carbide. As a result, a silicon carbide single crystal having a diameter of 17 mm was obtained. The use of the silicon carbide single crystal thus obtained (grown crystal) as a seed crystal enables to obtain a still larger silicon carbide single crystal. In the present invention, enlarging the growth chamber 1 in size makes it possible to produce a large-size silicon carbide single crystal using a large seed crystal as large as 3 or 4 inches in diameter.

It was found that the crystal growth of a single crystal is accomplished almost under the following conditions, not limited to the growth conditions employed in Examples 1 and 2 (in this case, propane ($C_3H_8$) is used as a hydrocarbon):
1) 1600° C.≦silicon source material temperature≦2200° C.
2) 2000° C.≦silicon carbide seed crystal temperature≦2500° C.
3) partition temperature=silicon carbide seed crystal temperature+ΔT, wherein ΔT is within a range of 10° C.<ΔT<200° C.
4) pressure of the atmosphere: 1 to 100 Torr
5) flow rate of $C_3H_8$: 10 to 1000 SCCM (depending on the source material temperature).

Although $C_3H_8$ is used as a hydrocarbon gas in the above-described Examples, other hydrocarbons (e.g., $CH_4$, $C_2H_2$ and $C_2H_6$) may be used alternatively.

Furthermore, a doped silicon carbide single crystal may also be obtained by, for example, mixing a gas containing a dopant material with a carrier gas and introducing the mixed gas into the growth space. Alternatively, modified methods may be applied in which, for example, a dopant is mixed in a hydrocarbon gas or a silicon source material.

The method of the present invention employs silicon and hydrocarbons as source materials, for which high-purity materials are available at a low cost. Furthermore, in the present invention, the use of a large-scale growth chamber facilitates to obtain a large-size single crystal of silicon carbide. Therefore, according to the method of the present invention, a large-size and high-purity single crystal of silicon carbide is produced easily and at a low cost. The method of the present invention may be suitably modified to obtain a doped silicon carbide single crystal as needed. The method of the present invention is thus widely available for various applications.

In particular, in the present invention, the reaction between silicon vapor and a carbon-containing compound gas is carried out at a condition of 2000° C.≦temperature of the silicon carbide seed crystal≦2500° C. As a result, even if various hydrocarbons are used as a source material, the hydrocarbon is decomposed to be a carbon source, so that a silicon carbide single crystal is easily obtained on a silicon carbide seed crystal.

While the invention has been described in detail and with reference to specific examples thereof, it will be apparent to one skilled in the art that various changes and modifications can be made therein without departing from the spirit and scope thereof.

What is claimed is:

1. A method of producing a silicon carbide single crystal comprising the step of:
    generating silicon vapor from molten silicon; and
    reacting the silicon vapor directly with a carbon-containing compound gas under a heated atmosphere to grow a silicon carbide single crystal on a silicon carbide seed crystal, wherein a hydrocarbon gas is employed as the carbon-containing compound gas.

2. A method of producing a silicon carbide single crystal as claimed in claim 1, wherein the step of reacting process comprises the following steps of:
    adhering the silicon carbide seed crystal to a growth chamber in a growth space thereof;
    charging and heating silicon powder in the growth chamber to provide the silicon vapor, said silicon vapor diffusing into the growth space through a first tube;
    introducing the hydrocarbon gas into the growth space through a second tube, and
    thereby reacting the silicon vapor directly with the hydrocarbon gas in the growth space.

3. A method of producing a silicon carbide single crystal as claimed in claim 1, wherein the silicon vapor is reacted with the carbon-containing compound gas under a condition that the temperature of the silicon carbide seed crystal is between 2000° C. (inclusive) and 2500° C. (inclusive).

4. A method of producing a silicon carbide single crystal as claimed in claim 1, wherein the temperature of said silicon vapor is between 1600° C. (inclusive) and 2200° C. (inclusive).

5. A method of producing a silicon carbide single crystal as claimed in claim 1, wherein the hydrocarbon gas is at least one member selected from the group consisting of gases of aromatic hydrocarbons and aliphatic hydrocarbons.

6. A method of producing a silicon carbide single crystal as claimed in claim 2, wherein materials of said growth chamber and said first and second tubes are selected from the group consisting of graphite, SiC coated graphite, Ta, W and carbides of Ta or W.

7. A method of producing a silicon carbide single crystal as claimed in claim 2, wherein the step of reacting process further comprises the following step of:

introducing an inert gas as a carrier gas with the hydrocarbon gas.

8. A method of producing a silicon carbide single crystal as claimed in claim 5, wherein said aliphatic hydrocarbon is unsaturated hydrocarbon.

9. A method of producing a silicon carbide single crystal as claimed in claim 8, wherein said unsaturated hydrocarbon is an olefin hydrocarbon or an acetylene hydrocarbon.

* * * * *